(12) United States Patent
Lee et al.

(10) Patent No.: US 12,740,131 B2
(45) Date of Patent: Sep. 15, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Seungheon Lee, Suwon-si (KR); Donghyun Roh, Suwon-si (KR); Jangho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 294 days.

(21) Appl. No.: 18/481,433

(22) Filed: Oct. 5, 2023

(65) Prior Publication Data

US 2024/0136426 A1 Apr. 25, 2024
US 2024/0234542 A9 Jul. 11, 2024

(30) Foreign Application Priority Data

Oct. 21, 2022 (KR) ........................ 10-2022-0136362

(51) Int. Cl.
*H10D 84/01* (2026.01)
*H10D 62/10* (2025.01)
(Continued)

(52) U.S. Cl.
CPC ....... *H10D 84/0153* (2025.01); *H10D 62/121* (2025.01); *H10D 64/017* (2025.01);
(Continued)

(58) Field of Classification Search
CPC ........... H01L 29/66545; H01L 29/0673; H01L 29/42392; H01L 29/66439; H01L 29/775; H01L 29/78696; H01L 27/088; H01L 21/823437; H01L 21/823475; H10D 84/0153; H10D 62/121; H10D 64/017;
(Continued)

(56) References Cited

U.S. PATENT DOCUMENTS 8,778,749 B2 7/2014 Pachamuthu et al.
9,334,572 B2 5/2016 Ou et al.
(Continued)

FOREIGN PATENT DOCUMENTS

KR 101134184 B1 4/2012
KR 10-2019-0118820 A 10/2019
(Continued)

*Primary Examiner* — Earl N Taylor
(74) *Attorney, Agent, or Firm* — Wolf, Greenfield & Sacks, P.C.

(57) ABSTRACT

A method of manufacturing a semiconductor device, includes forming a mask layer on a semiconductor structure having a plurality of gate lines and a plurality of intergate insulating portions, forming an opening that exposes a cut region of the plurality of gate lines in the mask layer, forming a separation hole by removing a portion of a gate capping layer exposed by the opening, forming a pyrolysis material pattern in the separation hole, forming an etch stop layer on an upper surface of the mask layer and on a side wall portion of the separation hole from which the pyrolysis material pattern is removed, while the pyrolysis material pattern is decomposed and removed, and removing a portion of the gate electrode exposed by the separation hole using the etch stop layer.

20 Claims, 17 Drawing Sheets

(51) Int. Cl.

*H10D 64/01* (2025.01)
*H10D 84/03* (2025.01)
*H10D 84/83* (2025.01)

(52) U.S. Cl.

CPC ..... *H10D 84/0135* (2025.01); *H10D 84/0149* (2025.01); *H10D 84/0158* (2025.01); *H10D 84/038* (2025.01); *H10D 84/832* (2025.01); *H10D 84/834* (2025.01)

(58) Field of Classification Search

CPC ........... H10D 84/0135; H10D 84/0149; H10D 84/0158; H10D 84/038; H10D 84/832; H10D 84/834

See application file for complete search history.

(56) References Cited

U.S. PATENT DOCUMENTS 10,243,080 B2 3/2019 Kloster et al.
11,264,294 B2 3/2022 Lee et al.
11,282,745 B2 3/2022 Yu et al.
11,450,662 B2 * 9/2022 You ........................ H10D 30/43
11,916,072 B2 * 2/2024 You ...................... H10D 84/834
2011/0012103 A1 1/2011 Yang et al.
2015/0380526 A1 12/2015 Godet et al.
2019/0148128 A1 5/2019 Smith et al.
2020/0119163 A1 * 4/2020 Xie ................... H01L 21/28079
2020/0220016 A1 * 7/2020 Guler ................ H01L 21/02238
2020/0395244 A1 12/2020 Lee et al.
2021/0125875 A1 * 4/2021 Tsai ..................... H10D 84/038
2021/0305244 A1 * 9/2021 Bouche .............. H10D 84/0151
2021/0336000 A1 10/2021 Yamaguchi et al.
2022/0045051 A1 * 2/2022 You ...................... H10D 30/014
2022/0085011 A1 * 3/2022 Lee ................... H01L 21/76883
2022/0093388 A1 3/2022 Nakatani et al.
2022/0336664 A1 * 10/2022 Bae ...................... H10D 62/121
2022/0367457 A1 * 11/2022 You .................... H10D 30/6735
2022/0384270 A1 * 12/2022 Tsai ................... H10D 84/0151
2022/0416057 A1 * 12/2022 Bouche ................ H10D 84/038
2023/0005910 A1 * 1/2023 Park ................... H10D 84/0167
2023/0097159 A1 * 3/2023 Lee ................... H01L 21/28123 438/585
2023/0124681 A1 * 4/2023 Xie ...................... H10D 62/126 257/369
2023/0139399 A1 * 5/2023 Zhou .................... H10D 62/118 257/506

FOREIGN PATENT DOCUMENTS

KR 10-2020-0009655 A 1/2020
KR 10-2314134 B1 10/2021

* cited by examiner 100
130 (130_2)
160
130 (130_1)
180
185 182
130 (130_3)
147
145
GL
141
142
L0
R
'A'
105
101
Z
Y
X
I2-I2'

'A'

'A'

'B'

SEMICONDUCTOR DEVICE AND METHOD OF MANUFACTURING THE SAME

CROSS-REFERENCE TO RELATED APPLICATION(S)

This application claims benefit of priority to Korean Patent Application No. 10-2022-0136362 filed on Oct. 21, 2022 in the Korean Intellectual Property Office, the disclosure of which is incorporated herein by reference in its entirety.

BACKGROUND

The present inventive concept relates to a semiconductor device and a method of manufacturing the same.

As demand for high performance, high speed and/or multifunctionality of semiconductor devices increases, demand for high integration of semiconductor devices is also increasing. According to the downscaling of semiconductor devices, a short channel effect of a transistor may occur, and thus, reliability of an integrated circuit device may deteriorate. In order to reduce the short channel effect, a semiconductor device including a fin-type active pattern has been proposed. In addition, as design rules decrease, a highly reliable gate cut technology is required.

SUMMARY

Some embodiments of the present inventive concept provide a semiconductor device capable of solving problems (e.g., loss of an interlayer insulating layer) occurring in a gate line cutting process.

Some embodiments of the present inventive concept provide a method of manufacturing a semiconductor device capable of solving problems (e.g., loss of an interlayer insulating layer) occurring in a gate line cutting process.

According to some embodiments of the present inventive concept, a method of manufacturing a semiconductor device includes providing a semiconductor structure including a plurality of active patterns that extend on a substrate in a first direction, a plurality of gate lines that intersect the plurality of active patterns and that extend in a second direction, that intersects the first direction, and an interlayer insulating layer having a plurality of intergate insulating portions that overlap respective ones of the plurality of active patterns and are respectively between ones of the plurality of gate lines, wherein each of the plurality of gate lines includes a gate electrode and a gate capping layer on the gate electrode, forming a mask layer on the plurality of gate lines and the plurality of intergate insulating portions, forming an opening that exposes a cut region of the plurality of gate lines in the mask layer, forming a separation hole by removing a portion of the gate capping layer exposed by the opening using the mask layer, forming a pyrolysis material pattern in the separation hole, wherein an upper surface of the pyrolysis material pattern is lower than an upper surface of the mask layer, forming an etch stop layer on the upper surface of the mask layer and a side wall portion of the separation hole from which the pyrolysis material pattern is removed, while the pyrolysis material pattern is decomposed and removed, wherein a source material of the etch stop layer adsorbed on the pyrolysis material pattern is removed along with the decomposition of the pyrolysis material pattern, and selectively removing a portion of the gate electrode exposed by the separation hole using the etch stop layer.

According to some embodiments of the present inventive concept, a method of manufacturing a semiconductor device, includes providing a semiconductor structure including a plurality of active patterns that extend on a substrate in a first direction, a plurality of gate lines that intersect the plurality of active patterns and that extend in a second direction, that intersects the first direction, and a plurality of intergate insulating portions that overlap respective ones of the plurality of active patterns and are respectively between ones of the plurality of gate lines, wherein each of the plurality of gate lines includes a gate electrode and a gate capping layer on the gate electrode, forming a mask layer on the plurality of gate lines and the plurality of intergate insulating portions, forming an opening that exposes a cut region of the plurality of gate lines in the mask layer, forming a separation hole by removing a portion of the gate capping layer exposed by the opening using the mask layer, forming a pyrolysis material layer on the mask layer and in the separation hole, forming a pyrolysis material pattern in the separation hole by recessing the pyrolysis material layer, at a first temperature at which the pyrolysis material layer is decomposed, forming an etch stop layer on an upper surface of the mask layer and a side wall portion of the separation hole from which the pyrolysis material pattern is decomposed and exposed, at a second temperature at which the pyrolysis material pattern is decomposed, wherein a source material of the etch stop layer adsorbed on the pyrolysis material pattern is removed when the pyrolysis material pattern is decomposed, and selectively removing a portion of the gate electrode exposed by the separation hole using the etch stop layer.

According to some embodiments of the present inventive concept, a method of manufacturing a semiconductor device includes providing a semiconductor structure including a plurality of active patterns that extend on a substrate in a first direction, a plurality of gate lines that intersect the plurality of active patterns and that extend in a second direction, that intersects the first direction, and a plurality of intergate insulating portions that overlap respective ones of the plurality of active patterns and are respectively between ones of the plurality of gate lines, wherein the plurality of gate lines include adjacent first and second gate lines, and each of the plurality of gate lines includes a gate, an electrode and a gate capping layer on the gate electrode, forming a mask layer on the plurality of gate lines and the plurality of intergate insulating portions, forming a first opening that exposes a first cut region of the first gate line and a second opening that exposes a second cut region of the second gate line, in the mask layer, wherein the first and second cut regions are adjacent one another in the first direction, forming first and second separation holes by removing portions of the gate capping layer exposed by the first and second openings using the mask layer, including pyrolysis material patterns in each of the first and second separation holes, wherein upper surfaces of the pyrolysis material patterns are lower than an upper surface of the mask layer, forming an etch stop layer on the upper surface of the mask layer and on side wall portions of the first and second separation holes exposed by decomposition of the pyrolysis material patterns, while the pyrolysis material patterns are decomposed and removed, and removing portions of the gate electrode exposed by the first and second separation holes using the etch stop layer.

According to some embodiments of the present inventive concept, a semiconductor device includes a plurality of active patterns that extend on a substrate in a first direction, a plurality of gate lines that intersect the plurality of active patterns and that extend in a second direction that intersects the first direction, and respectively include a gate insulating layer, a gate electrode on the gate insulating layer, and a gate capping layer on the gate electrode, a plurality of intergate insulating portions that overlap respective ones of the plurality of active patterns and extend in the second direction between ones of the plurality of gate lines, and a first gate separation pattern and a second gate separation pattern that separate first and second gate lines among the plurality of gate lines, into gate line portions in the second direction, the first and second gate lines are adjacent to another in the first direction, wherein the plurality of intergate insulating portions include a first intergate insulating portion between the first and second gate lines, and wherein, in a cross-sectional view in the first direction, the first intergate insulating portion has an intermediate region having a width that is narrower than a width of an upper end of the first intergate insulating portion, and the intermediate region is adjacent to an upper surface of the gate electrode.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments will be described in detail with reference to the accompanying drawings.

Figure 1:
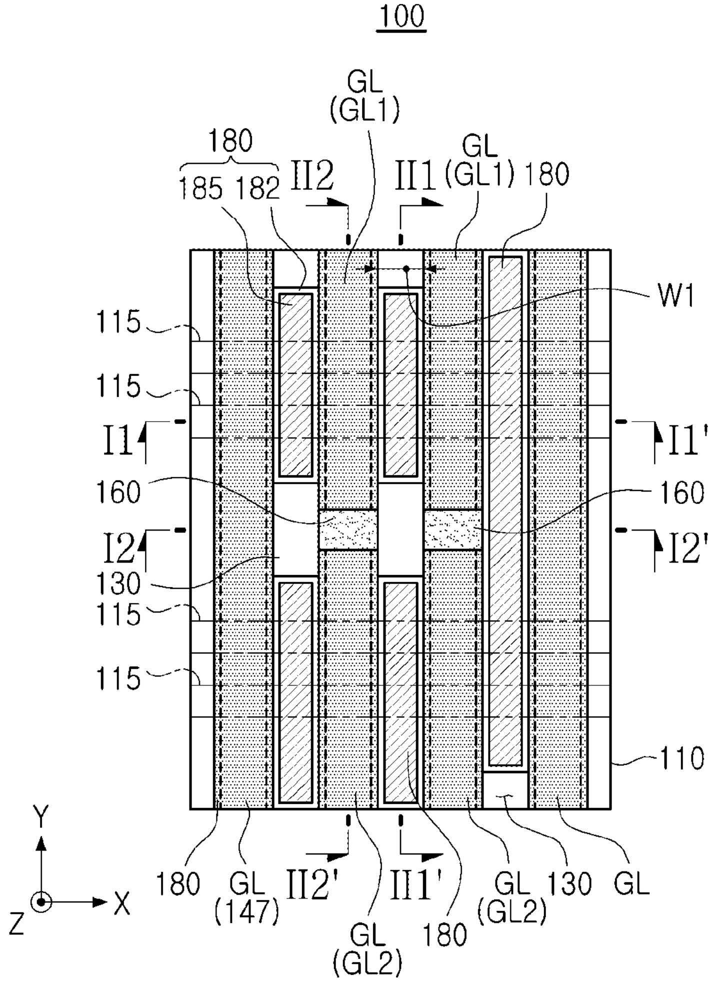
FIG. 1 is a plan view illustrating a semiconductor device according to some embodiments.
Figures 2A, 2B:
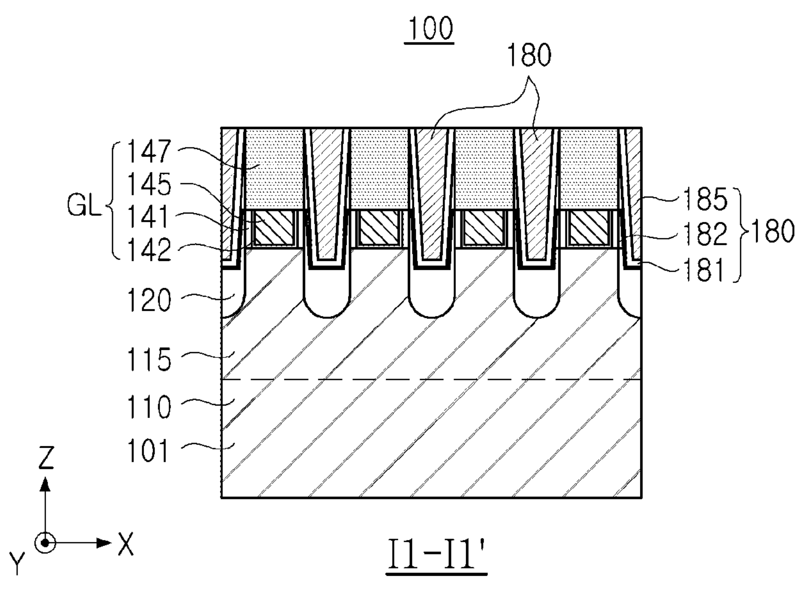
FIGS. 2A and 2B are cross-sectional views of the semiconductor device illustrated in FIG. 1, taken along lines I1-I1' and I2-I2', respectively.
Figure 3A:
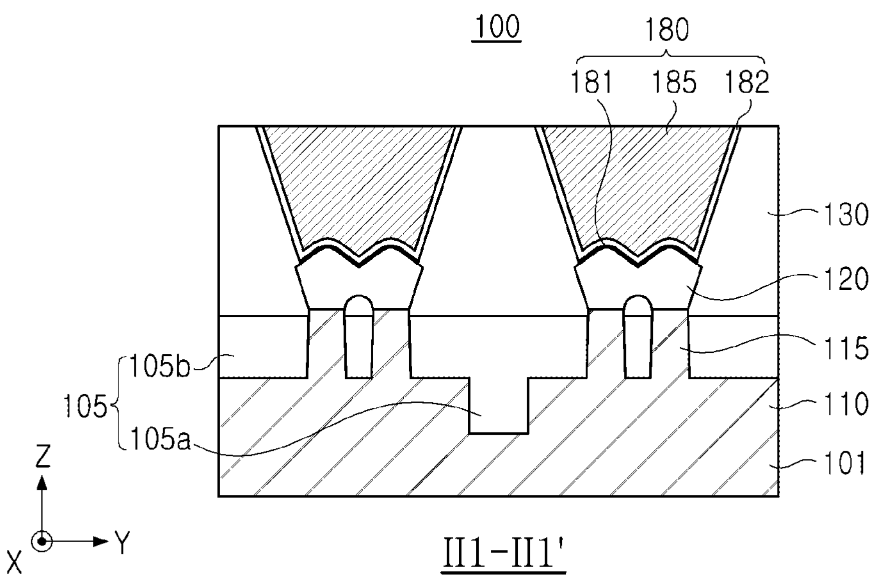
FIGS. 3A and 3B are cross-sectional views of the semiconductor device illustrated in FIG. 1, taken along lines II1-II1' and II2-II2', respectively.
Figure 3B:
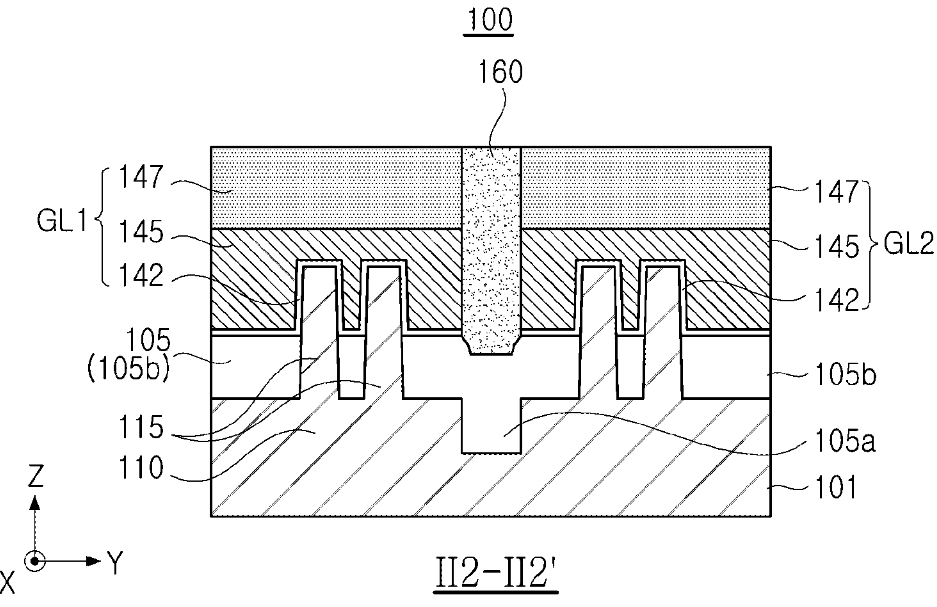

FIG. 1 is a plan view illustrating a semiconductor device according to some embodiments, and FIGS. 2A and 2B are cross-sectional views of the semiconductor device illustrated in FIG. 1, taken along lines I1-I1' and I2-I2', respectively. FIGS. 3A and 3B are cross-sectional views of the semiconductor device illustrated in FIG. 1, taken along lines II1-II1' and II2-II2', respectively.

Referring to FIGS. 1, 2A and 2B, a semiconductor device 100 according to the present embodiment may include an active region 110 disposed in a substrate 101, a plurality of active fins 115 extending in a first direction (e.g., an X-direction) in the active region 110, and a plurality of gate lines GL crossing the plurality of active fins 115 on the substrate 101 and extending in a second direction (e.g., a Y-direction), perpendicular to the first direction. In the present embodiment, some of the gate lines GL are illustrated as being separated into two gate lines GL1 and GL2 by a gate separation pattern 160.

The substrate 101 may include, for example, a semiconductor such as Si or Ge, or a compound semiconductor such as SiGe, SiC, GaAs, InAs, or InP. In some embodiments, the substrate 101 may have a silicon on insulator (SOI) structure. The active region 110 may be a conductive region such as a well doped with impurities or a structure doped with impurities. For example, the active region 110 may have an n-type well for a PMOS transistor or a p-type well for an NMOS transistor.

Each of the plurality of active fins 115 may have a fin-shaped pattern protruding in an upward direction (e.g., a Z-direction) from an upper surface of the active region 110. In this case, the "active fin" may be also referred to as an "active pattern." As illustrated in FIG. 1, the plurality of active fins 115 may be arranged side by side in the second direction in the active region 110. The active fins 115 may serve as channel regions of transistors. In the present embodiment, the active fins 115 are illustrated as being provided by two, but are not limited thereto, and may be provided in singular or in plural, other than the above.

A device isolation layer 105 may define the active region 110. The device isolation layer 105 may include silicon oxide or a silicon oxide-based insulating material. The device isolation region 105 may include a first isolation region 105*a* defining the active region 110 excluding the protruding active fins 115, and a second isolation region 105*b* defining the active fins 115. The first isolation region 105*a* may have a deeper bottom surface than the second isolation region 105*b*. For example, the first isolation region 105*a* may also be referred to as deep trench isolation (DTI), and the second isolation region 105*b* may also be referred to as shallow trench isolation (STI). The second isolation region 105*b* may be disposed on the active region 110. As described above, a portion of the active fin 115 may protrude from an upper portion of the second isolation region 105*b* while penetrating the second isolation region 105*b*.

The semiconductor device 100 according to the present embodiment may include the plurality of gate lines GL. As illustrated in FIG. 1, the gate lines GL may extend in the second direction (e.g., the Y-direction). The gate lines GL may overlap one region of each of the active fins 115. The gate lines GL may include gate spacers 141, a gate dielectric film 142 and a gate electrode 145, sequentially arranged between the gate spacers 141, and a gate capping layer 147 disposed on the gate electrode 145.

For example, the gate spacers 141 may include silicon nitride, silicon oxynitride, silicon carbonitride, or silicon oxycarbonitride. The gate dielectric film 142 may include at least one of a silicon oxide film, a silicon nitride film, a silicon oxynitride film, or a high dielectric film. The high dielectric film may include a material having a higher dielectric constant than a silicon oxide film, such as a hafnium oxide (HfO) film, an aluminum oxide (AlO) film, or a tantalum oxide (TaO) film. The gate electrode 145 may include a conductive material, and, for example, may include a metal nitride such as a titanium nitride (TiN) film, a tantalum nitride (TaN) film, or a tungsten nitride (WN) film, and/or a metal material such as aluminum (Al), tungsten (W), molybdenum (Mo), or the like, or a semiconductor material such as doped polysilicon. In some embodiments, the gate electrode 145 may be a multilayer including two or more films. In addition, the gate capping layer 147 may include, for example, silicon nitride, silicon oxynitride, silicon carbonitride, or silicon oxycarbonitride.

Referring to FIGS. 2A and 3A, the semiconductor device 100 according to the present embodiment may include a source/drain region 120 and a contact structure 180 connected to the source/drain region 120. The source/drain region 120 may be formed in a portion of the active fins 115 located on both sides of the gate lines GL.

In the present embodiment, the source/drain region 120 may include forming a recess in a portion of the active fin 115 and performing selective epitaxial growth (SEG) on the recess. The source/drain region 120 may include Si, SiGe, or Ge, and the source/drain region 120 may have a different material or a different shape, depending on an N-type transistor or a P-type transistor. For example, in a PMOS transistor, the source/drain region 120 may include silicon-germanium (SiGe), and may be doped with P-type impurities (e.g., boron (B), indium (In), or gallium (Ga)). A cross-section (see FIG. 3A, an Y-Z cross-section) of the source/drain region 120 may have a pentagonal shape. In an NMOS transistor, the source/drain region 120 may include silicon, and may be doped with N-type impurities (e.g., phosphorus (P), nitrogen (N), arsenic (As), or antimony (Sb)). A cross-section (the Y-Z cross-section) of the source/drain region 120 may be a hexagonal shape, or a polygonal shape having a gentle angle. As such, the active fins 115 may constitute or form a transistor, together with the gate lines GL and the source/drain region 120.

In the semiconductor device 100 according to the present embodiment, an interlayer insulating layer 130 may be disposed on the device isolation layer 105. The interlayer insulating layer 130 may be disposed around the gate lines GL. As illustrated in FIGS. 1, 2A, and 2B, the interlayer insulating layer 130 may alternate with the gate lines GL in the first direction (e.g., the X-direction), e.g., may be disposed between the gate lines GL. The interlayer insulating layer 130 may include a plurality of intergate insulating portions 130_1, 130_2, and 130_3 between respective ones the plurality of gate lines GL. In the present specification, the interlayer insulating layer 130 may also be referred to as an intergate insulating portion. For example, in the interlayer insulating layer 130, there may be a flowable oxide (FOX), a tonen silazen (TOSZ), an undoped silica glass (USG), a borosilica glass (BSG), a phosphosilaca glass (PSG), a borophosphosilica glass (BPSG), a plasma enhanced tetra ethyl ortho silicate (PETEOS), a fluoride silicate glass (FSG), a high density plasma (HDP) oxide, a plasma enhanced oxide (PEOX), a flowable CVD (FCVD) oxide, or a combination thereof. The interlayer insulating layer 130 may be formed using a chemical vapor deposition (CVD), a flowable-CVD process, or a spin coating process.

The contact structure 180 employed in the present embodiment may be formed by passing through the interlayer insulating layer 130 (in particular, the intergate insulating portions 130_1, 130_2, and 130_3), and may be connected to the source/drain region 120, respectively. As illustrated in FIGS. 2A and 3A, the contact structure 180 may include a metal-silicide layer 181, a conductive barrier 182, and a contact plug 185. The conductive barrier 182 may cover or overlap side and lower surfaces of the contact plug 185. The metal-silicide layer 181 may be disposed between the conductive barrier 182 and the source/drain regions 120. For example, the conductive barrier 182 may include Ta, TaN, Mn, MnN, WN, Ti, or TiN. The metal-silicide layer 181 may include CoSi, NiSi, or TiSi. The contact plug 185 may include tungsten (W), cobalt (Co), titanium (Ti), an alloy thereof, or a combination thereof. In addition, the semiconductor device 100 according to the present embodiment may include an interconnection structure (not illustrated) on the interlayer insulating layer 130 and connected to the contact structure 180. The interconnection structure may include dielectric layers disposed on the interlayer insulating layer 130, and interconnection lines on each of the dielectric layers and electrically connected to the contact structure 180.

Referring to FIGS. 1, 3A, and 3B, some of the gate lines GL may be divided into two gate lines, e.g., first and second gate lines GL1 and GL2 by the gate separation pattern 160. The gate separation pattern 160 may be formed by filling an insulating material in a gate separation hole separating the gate lines. For example, the gate separation pattern 160 may include silicon nitride (SiN), silicon oxynitride (SiON), silicon carbonitride (SiCN), or silicon oxycarbonitride (SiOCN).

In the semiconductor device 100 according to the present embodiment, loss of the interlayer insulating layer, e.g., the intergate insulating portion 130 may be reduced during formation of the gate separation pattern 160. In particular, since loss of an upper region of the intergate insulating portion hardly occurs, subsequent processes may be stably performed. Unlike the present embodiment, in a process of forming a conventional gate separation pattern 160, an upper region of an intergate insulating portion 130 around a gate separation hole CH may be greatly lost while a portion of a gate line of a gate cut region is removed. The lost upper region (e.g., $SiO_2$) of the intergate insulating portion 130 may be replaced with another material (e.g., SiN) during formation of the gate separation pattern 160. In this case, since a hole for a contact structure 180 is not well formed in a portion of the interlayer insulating layer 130 replaced with another material, it may be difficult to form the contact structure 180, or defects may be generated.

To solve this problem, in the present embodiment, in a process of forming the gate separation pattern 160, the intergate insulating portion 130 located around the gate separation pattern 160 may be maintained to be relatively stable by protecting an upper region 130U of the intergate insulating portion 130 with an etch stop layer 270 without loss thereof (see FIGS. 8A to 8D). As a result, the contact structure 180 passing through a vicinity thereof may be easily formed. For example, referring to FIGS. 1 and 3A, the contact structure 180 may be stably formed in an intergate insulating portion 130 adjacent to the gate separation pattern 160.

The etch stop layer 270 (FIG. 8C) introduced in the present embodiment may be formed on the upper region of the intergate insulating portion 130 using a pyrolysis material layer 250, after removing the gate capping layer 147 in a gate cut region. The pyrolysis material layer 250 may be formed by the heating of an organic material, such as biomass, in the absence of oxygen or near absence of oxygen. Therefore, almost no loss may occur in the upper region 130U of a final intergate insulating portion 130 obtained after removing a remaining portion of the gate line (e.g., gate electrode), but some loss may occur in an intermediate region 130M and a lower region 130L (see FIGS. 2B and 4)

Figure 4:
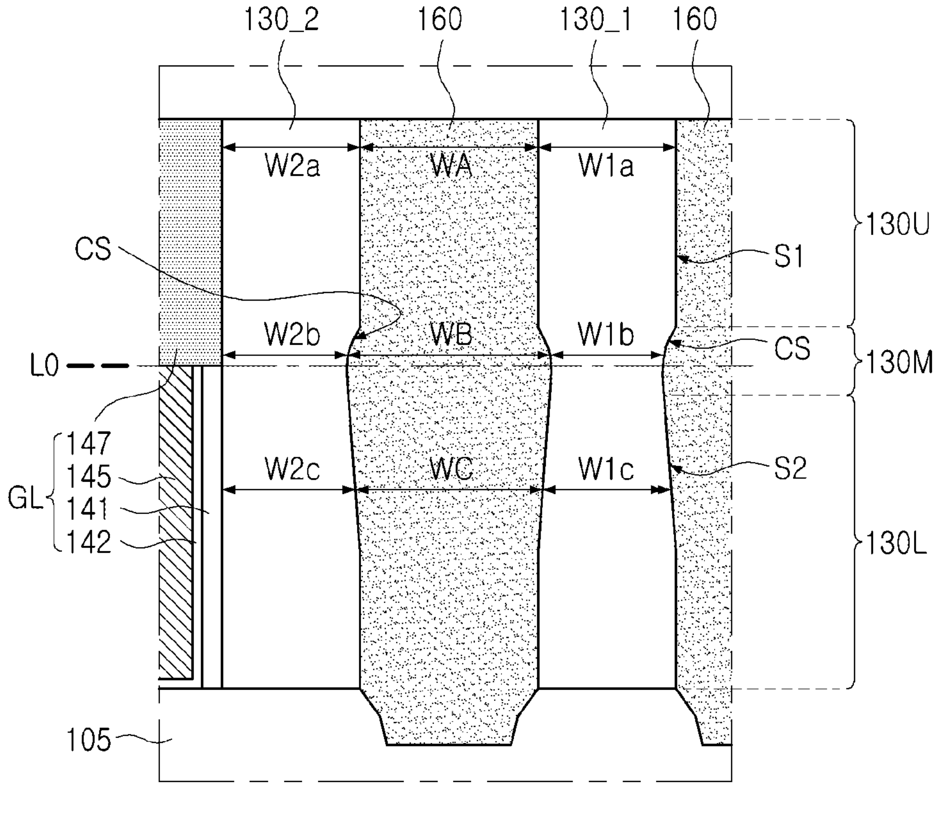
FIG. 4 is a partially enlarged view illustrating a portion of the semiconductor device illustrated in FIG. 2B.

FIG. 4 is a partially enlarged view illustrating portion "A" of the semiconductor device illustrated in FIG. 2B.

Referring to FIG. 2B, the intergate insulating portion 130 may include a first intergate insulating portion 130_1 on both sides of which gate separation patterns 160 are located, a second intergate insulating portion 130_2 on only one side of which a gate separation pattern 160 is located, and a third intergate insulating portion 130_3 not contacting a gate separation pattern 160.

Referring to FIG. 4 together with FIG. 2B, the first intergate insulating portion 130_1 may have a second width W1*b* of the intermediate region 130M in the first direction (the X-direction), narrower than a first width W1*a* of the upper end in the first direction (the X-direction). The intermediate region 130M may be located adjacent to a level LO of an upper surface of the gate electrode 145. The intermediate region 130M may somewhat have a concave portion CS. The second width W1*b* of the intermediate region 130M may be narrower than a third width W1*c* of the lower region 130L in the first direction (the X-direction). In the present embodiment, the lower region 130L may have a portion having the third width W1*c*, slightly narrower than the first width W1*a* of the upper end. A lower end (i.e., a bottom portion) of the lower region 130L may have a width, equal to or greater than the first width W1*a*.

In this specification, the intermediate region 130M of the first intergate insulating portion 130_1 may be defined as a region in which the concave portion CS adjacent to the level LO of the upper surface of the gate electrode 145 is located, and the upper region 130U and the lower region 130L may be divided based on the intermediate region 130M. Such a change in width may be implemented as a result of etching in the process of forming the gate separation pattern 160. This will be described in detail with reference to FIGS. 9A to 9C.

A side surface of the first intergate insulating portion 130_1 contacting the gate separation pattern 160 may have a unique profile. A side portion S1 of the upper region 130U may be substantially vertical, or, at least, may have a surface relatively close to a vertical surface, as compared to a side portion S2 of the lower region 130L.

Similarly, the second intergate insulating portion 130_2 may also have a second width W2*b* of the intermediate region, narrower than a first width W2*a* of the upper end. The intermediate region 130M adjacent to the level LO of the gate electrode 145 may somewhat have a concave portion CS. The second width W2*b* of the intermediate region 130M may be narrower than a third width W2*c* of the lower region 130L in the first direction (the X-direction), and the lower region 130L may have a portion having the third width W2*c*, slightly narrower than the first width W2*a* of the upper end.

A side surface of the second intergate insulating portion 130_2 contacting the gate separation pattern 160 may also be similar to the side surface of the first intergate insulating portion 130_1. For example, a side portion of the intermediate region 130M has a concave portion CS, and a side portion of the upper region 130U may be also substantially vertical, or, at least, may have a surface relatively close to a vertical surface, as compared to a side portion of the lower region 130L.

In the process of etching the gate electrode 145, unlike the lower region 130L, the upper region 130U may be protected by the etch stop layer 250 (FIG. 9B) (see FIGS. 8D and 9C), a difference in the side slope may occur. In addition, since the etch stop layer 250 (FIG. 9B) may be thinly formed or partially not formed in a region adjacent to the upper surface of the gate electrode 145, side surfaces of the intermediate region 130M of the first and second intergate insulating portions 130_1 and 130_2 may have an etched concave portion CS.

Despite partial loss of the first and second intergate insulating portions 130_1 and 130_2, the upper region 130U of the first and second intergate insulating portions 130_1 and 130_2 may be maintained with almost no loss. Therefore, a subsequent process (a process of forming the contact structure 180) may be stably performed. The upper region 130U of the first and second intergate insulating portions 130_1 and 130_2 may have substantially the same widths W1*a* and W2*a* as the widths of regions not contacting the gate separation pattern 160, in a different intergate insulating portion (e.g., 130_3) or in the same intergate insulating portion (e.g., 130_1 and 130_2), in the first direction (the X-direction). Similarly, the intermediate region 130M of the first and second intergate insulating portions 130_1 and 130_2 may have widths W1*b* and W2*b*, narrower than the widths of the regions not contacting the gate separation pattern 160, in a different intergate insulating portion (e.g., 130_3) or in the same intergate insulating portion (e.g., 130_1 and 130_2), in the first direction (the X-direction).

Characteristics of the width and side profile of the first and second intergate insulating portions 130_1 and 130_2 in the first direction (the X-direction) may also be expressed in terms of the gate separation pattern 160. For example, the gate separation pattern 160 may have a second width WB of the intermediate region, wider than a width WA of the upper end in the first direction (the X-direction). The intermediate region adjacent to the level LO of the gate electrode 145 may have a convex portion corresponding to the concave portion CS. The second width WB of the intermediate region may be wider than a third width WC of the lower region in the first direction (the X-direction), and the lower region may have a portion having the third width WC, slightly narrower than the first width WA of the upper end.

Figure 5A:
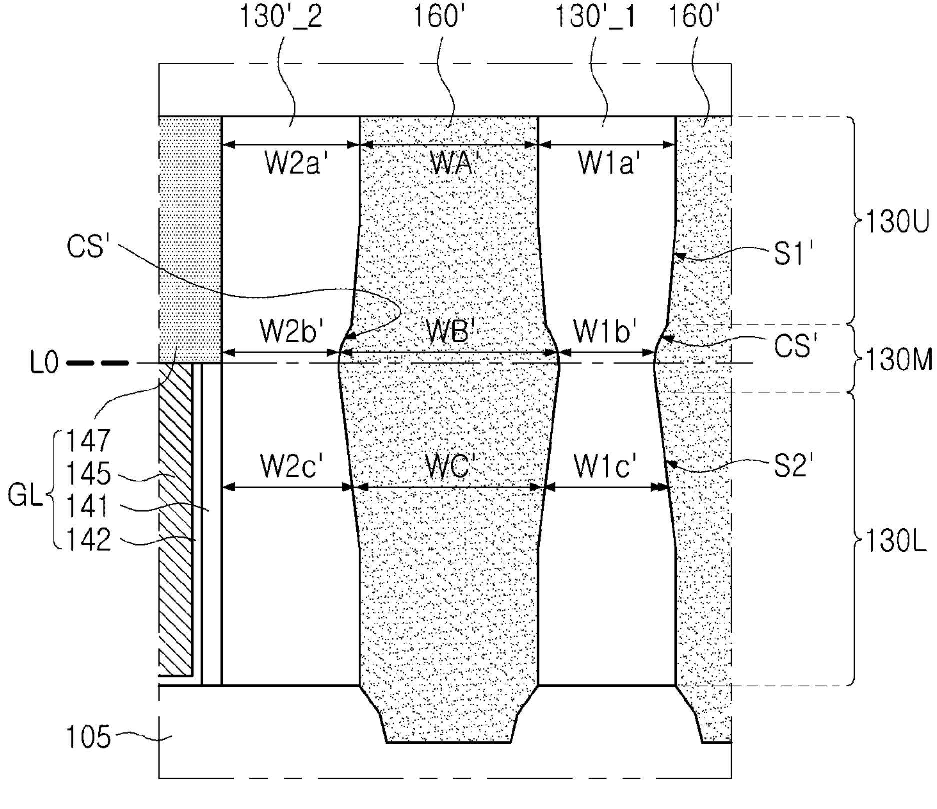
FIGS. 5A and 5B are partial cross-sectional views illustrating semiconductor devices according to various embodiments.
Figure 5B:
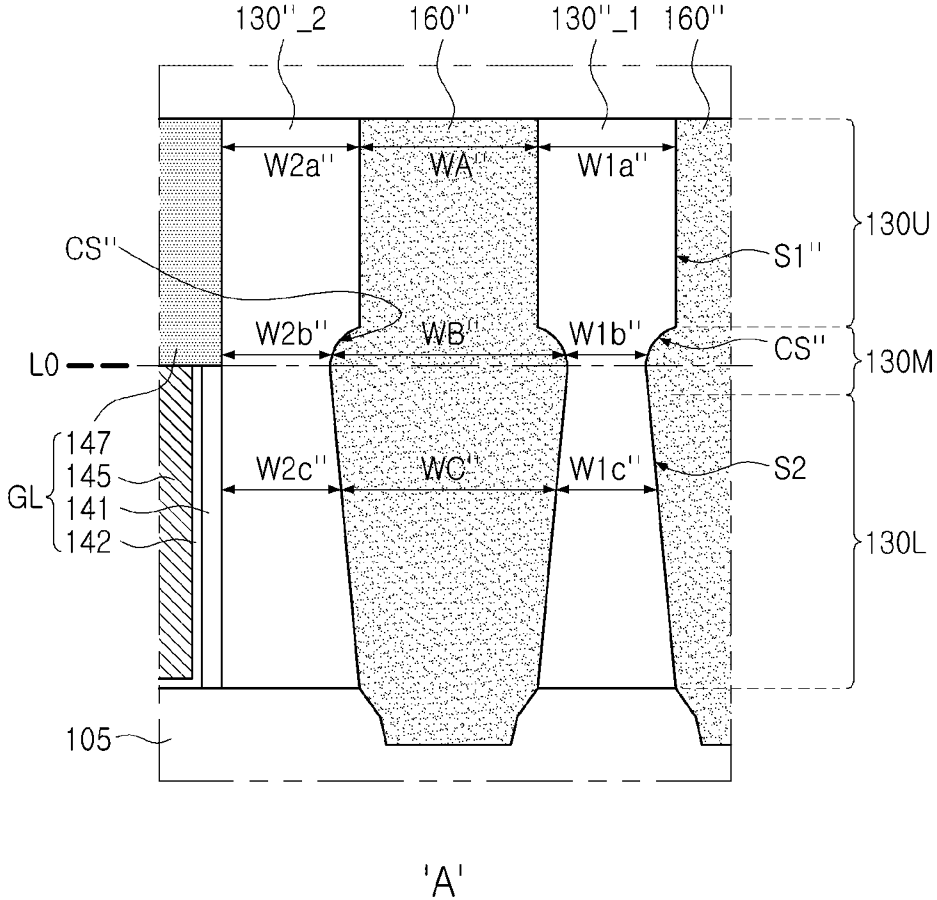

FIGS. 5A and 5B are partial cross-sectional views illustrating semiconductor devices according to various embodiments. FIGS. 5A and 5B may be understood as partially enlarged views of the semiconductor device corresponding to FIG. 4.

Referring to FIG. 5A, it can be understood that a semiconductor device according to the present embodiment is similar to the semiconductor device illustrated in FIGS. 1 to 4, except that intergate insulating portions 130'_1 and 130'_2 have different side profiles, in particular, a portion of an upper region 130U has an inclined side surface S1'. In addition, components of the present embodiment can be understood with reference to descriptions of the same or similar components of the embodiment illustrated in FIGS. 1 to 4, unless otherwise stated.

Similar to the previous embodiment, a first intergate insulating portion 130'_1 may have a second width W1*b*' of an intermediate region 130M, narrower than a first width W1*a*' of an upper end, and the intermediate region 130M may have a concave portion CS'. The concave portion CS' is concave-shaped downward towards substrate 101. The second width W1*b*' of the intermediate region 130M may be narrower than a third width W1*c*' of a lower region 130L.

In the present embodiment, a side portion S1' of an upper region 130U of the first intergate insulating portion 130'_1 may have an inclined surface adjacent to the intermediate region, and the concave portion CS' of the intermediate region 130M may be formed deeper than the concave portion CS of the previous embodiment. A side portion S2' of a lower region 130L of the first intergate insulating portion 130'_1 may have somewhat a steeper slope than the previous embodiment.

Similarly, a second intergate insulating portion 130'_2 may also have a second width W2*b*' of the intermediate region 130M, narrower than a first width W2*a*' of the upper end. The intermediate region 130M may have somewhat a concave portion CS'. The second width W2*b*' of the intermediate region 130M may be narrower than a third width W2*c*' of the lower region 130L, and the lower region 130L may have a portion having the third width W2*c*', slightly narrower than the first width W2*a*' of the upper end.

Similar to the previous embodiment, a gate separation pattern 160' may have a second width WB' of the intermediate region, wider than a width WA' of the upper end. The intermediate region may have a convex portion corresponding to the concave portion CS'. The second width WB' of the intermediate region may be wider than a third width WC' of the lower region, and the lower region may have a portion having the third width WC', slightly narrower than the first width WA' of the upper end.

Referring to FIG. 5B, it can be understood that a semiconductor device according to the present embodiment is similar to the semiconductor device illustrated in FIGS. 1 to 4, except that intergate insulating portions 130'_1 and 130'_2 have different side profiles, in particular, a lower region 130L has an side surface S2', which is almost entirely inclined. In addition, components of the present embodiment can be understood with reference to descriptions of the same or similar components of the embodiment illustrated in FIGS. 1 to 4, unless otherwise stated.

Similar to the previous embodiment, a first intergate insulating portion 130"_1 may have a second width W1*b*" of an intermediate region 130M, narrower than a first width W1*a*" of an upper end, and the intermediate region 130M may have a concave portion CS." The second width W1*b*" of the intermediate region 130M may be narrower than a third width W1*c*" of a lower region 130L.

A side portion S1" of an upper region 130U of the first intergate insulating portion 130"_1 may have a nearly vertical side surface, but the concave portion CS" of the intermediate region 130M may be formed deeper than the concave portion CS of the previous embodiment. This can be understood as a structure that occurs when an exposed region ("CA" in FIG. 9B) not covered or not overlapped by the etch stop layer is somewhat large. Unlike the previous embodiment, a side portion S2" of the lower region 130L of the first intergate insulating portion 130"_1 may have an overall inclined surface.

Similarly, the second intergate insulating portion 130"_2 may also have a second width W2*b*" of the intermediate region 130M, narrower than a first width W2*a*" of the upper end. The intermediate region 130M may have a concave portion CS". The concave portion CS" is concave-shaped downward towards substrate 101. The second width W2*b*" of the intermediate region 130M may be narrower than a third width W2*c*" of the lower region 130L, and the lower region 130L may have a portion having the third width W2*c*", slightly narrower than the first width W2*a*" of the upper end.

Similar to the previous embodiment, a gate separation pattern 160" may have a second width WB" of the intermediate region, wider than a width WA" of the upper end. The intermediate region may have a convex portion corresponding to the concave portion CS." The second width WB" of the intermediate region may be wider than a third width WC" of the lower region, and the lower region may have a portion having the third width WC', slightly narrower than the first width WA" of the upper end.

Hereinafter, a method of manufacturing a semiconductor device according to some embodiments will be described in detail with reference to FIGS. 6A and 6B, FIGS. 7A and 7B, and FIGS. 8A to 8E. Illustrated processes may be processes for manufacturing the semiconductor device 100 illustrated in FIGS. 1 to 4, and may represent processes for forming a gate separation pattern.

FIGS. 6A and 6B and FIGS. 7A and 7B are plan views and cross-sectional views of major processes illustrating a method of manufacturing a semiconductor device according to an embodiment, respectively.

Figure 6A:
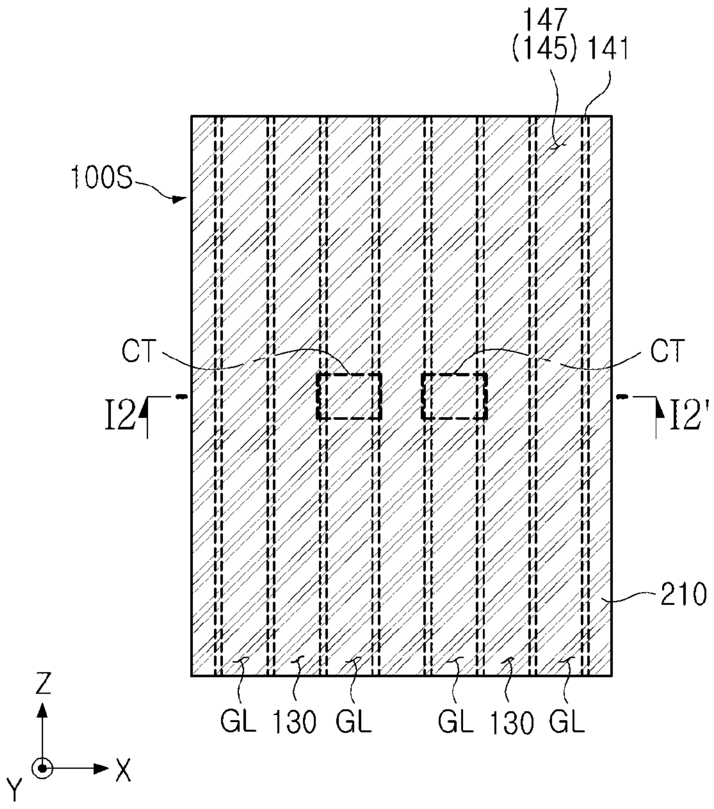
FIGS. 6A and 6B and FIGS. 7A and 7B are plan views and cross-sectional views of major processes illustrating a method of manufacturing a semiconductor device according to some embodiments.
Figure 6B:
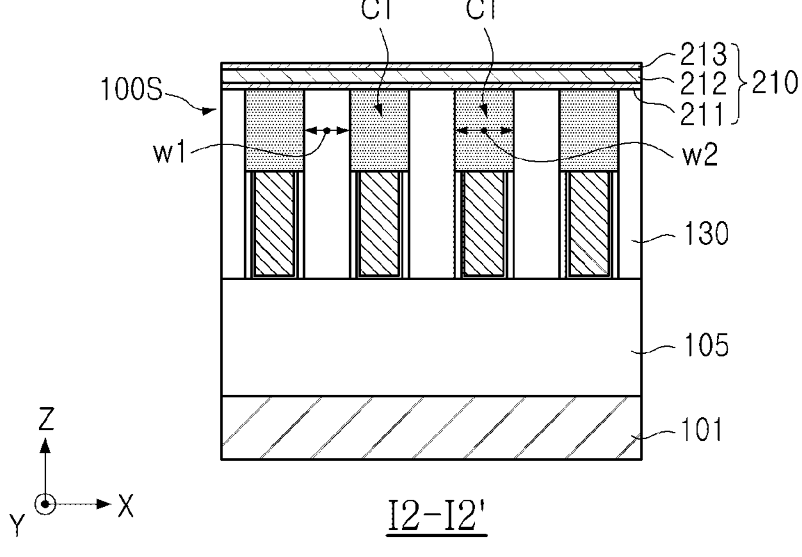

First, referring to FIGS. 6A and 6B, a mask layer 210 may be formed on an upper surface of a semiconductor structure 100S.

The semiconductor structure 100S may be a structure for a semiconductor device 100, and may include, as shown in FIGS. 3A and/or 3B, an active region 110 having a plurality of active fins 115 extending in the first direction (e.g., the X-direction) on a substrate 101, a plurality of gate lines GL extending in the second direction (e.g., the Y-direction), intersecting the plurality of active fins 115, and an interlayer insulating layer 130 located around the plurality of gate lines GL. As described above, a gate line GL employed in the present embodiment may include gate spacers 141, a gate dielectric film 142, a gate electrode 145, and a gate capping layer 147. The interlayer insulating layer 130 may include a plurality of intergate insulating portions 130 located between the plurality of gate lines GL. The plurality of intergate insulating portions 130 may be portions of the interlayer insulating layer, and may have portions extending in parallel with the plurality of gate lines GL.

As illustrated in FIG. 6A, the mask layer 210 may be formed on an upper surface on which the plurality of gate lines GL and the plurality of intergate insulating portions 130 are alternately arranged. The mask layer 210 employed in the present embodiment may include a stack body having different material films. Each of the material films of the stack body may be determined according to a material of a gate line to be selectively removed during a gate cut process.

The mask layer 210 may include a first mask film 211 including a first material, a second mask film 212 disposed on the first mask film 211 and including a second material, different from the first material, and a third mask film 213 disposed on the second mask film 212 and including a third material, different from the second material. In some embodiments, the first material may be the same as or similar to the third material, and the second material may include a material having an etch selectivity, different from those of the first and third materials. For example, the first and third materials may include silicon oxide or silicon oxycarbide, and the second material may include silicon nitride, silicon oxynitride, silicon carbonitride, or silicon oxycarbonitride.

Figure 7A:
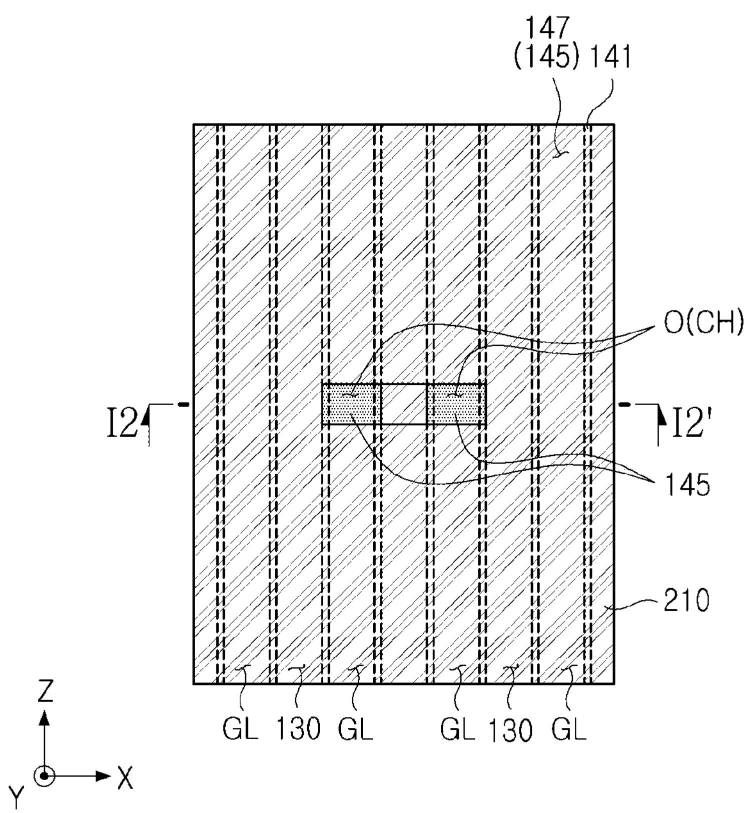
Figure 7B:
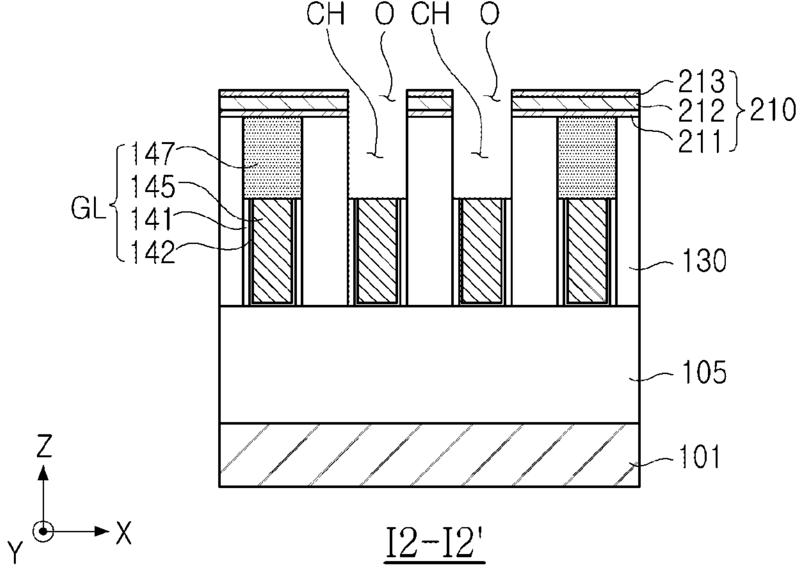

Next, referring to FIGS. 7A and 7B, an opening O may be formed in the mask layer 210 to expose a cut region CT of the gate line GL, and a separation hole CH may be formed by removing a portion of the gate capping layer 147 exposed by the opening O.

The opening O (FIGS. 7A and 7B) may be formed in the mask layer 210' using a photolithography process, to expose a desired cut region CT of the gate line GL. In some embodiments, for example, the first and third mask films 211 and 213 may be silicon oxide films, and the second mask film 212 and the gate capping layer 147 may be formed of silicon nitride. In a process of forming the opening O, a portion of the third mask film 213 between the openings O may be removed, and in a process of removing an exposed portion of the gate capping layer 147, the portion of the third mask film 213 between the openings O may be removed. In some embodiments, in a process of forming the separation hole CH, an exposed portion of the gate capping layer 147 may be removed using the third mask film 213. Since the process of forming the separation hole CH may be performed by a wet etching process having relatively high selectivity, loss of the intergate insulating portion 130 may be minimized.

Next, a process of forming an etch stop layer using a pyrolysis material may be performed. FIGS. 8A to 8E are cross-sectional views of major processes illustrating processes of forming an etch stop layer and removing a gate electrode in a method of manufacturing a semiconductor device according to an embodiment.

Figure 8A:
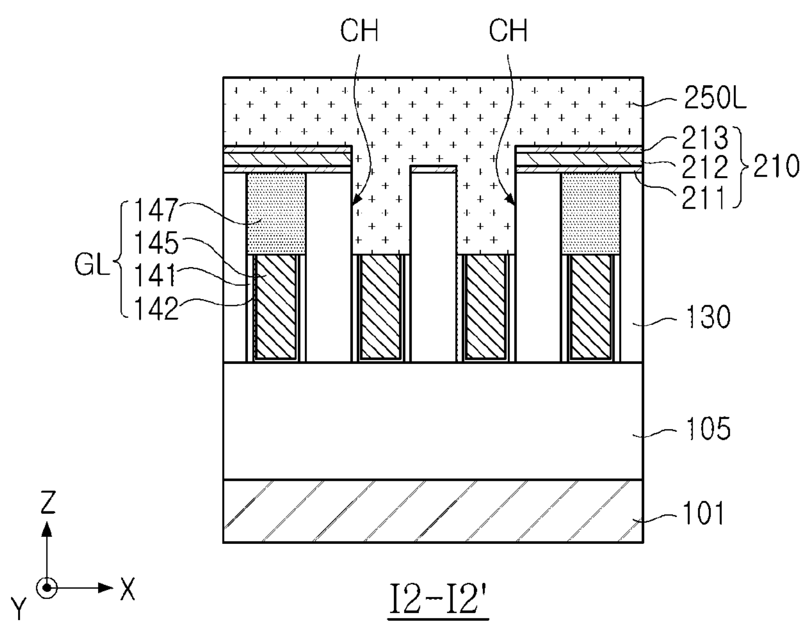
FIGS. 8A to 8E are cross-sectional views of major processes illustrating a method of manufacturing a semiconductor device according to some embodiments.

Referring to FIG. 8A, a pyrolysis material layer 250L may be formed on a mask layer 210' to fill a separation hole CH.

The pyrolysis material layer 250L may include a material that may be decomposed at a high temperature (e.g., a temperature of 50° C. or higher). In some embodiments, the pyrolysis material layer 250L may include an organic compound including carbon, hydrogen, oxygen, and/or nitrogen. The present inventive concept is not limited thereto, and the pyrolysis material layer 250L may include an organic compound including an aromatic or aliphatic hydrocarbon, a derivative thereof, or a polymer thereof.

In some embodiments, the pyrolysis material layer 250L may be formed by a spin coating process, a chemical vapor deposition process, or the like. The pyrolysis material layer 250L may be formed to cover or overlap the mask layer by filling the separation hole CH. For example, the pyrolysis material layer 250L may be formed by a spin coating process at a temperature of about 50° C. to about 200° C. and a pressure of about 0 to 760 torr.

Subsequently, referring to FIG. 8B, at a first temperature at which the pyrolysis material layer 250L is decomposed, the pyrolysis material layer 250L may be recessed to form a pyrolysis material pattern 250 filled in the separation hole CH.

In a heat recess process, the pyrolysis material layer may be decomposed from the top such that an upper surface of the pyrolysis material layer may be lowered. In some embodiments, a portion of the pyrolysis material layer 250L located on the mask layer 210' may be removed using a heat recess process. After the heat recess process, the pyrolysis material layer 250L may remain as the pyrolysis material pattern 250 filled in the separation hole CH. The pyrolysis material pattern 250 may cover or overlap an intergate insulating portion 130 such that the intergate insulating portion 130 is not exposed in the separation hole CH. In some embodiments, as illustrated in FIG. 8B, an upper surface 250T of the pyrolysis material pattern 250 may be lower than an upper surface of the mask layer 210.

The first temperature at which this process is performed may be performed at a temperature of 200° C. or higher, for example, 200° C. to 450° C. The first temperature for the heat recess process may be implemented at a higher temperature than a second temperature of a subsequent pyrolysis process. The heat recess process may be performed by supplying heat to a semiconductor structure 100S using a chamber-type heater or a batch-type heater. The heat recess process may be performed within a range in which thermal damage is not applied to the semiconductor structure 100S.

Figure 8B:
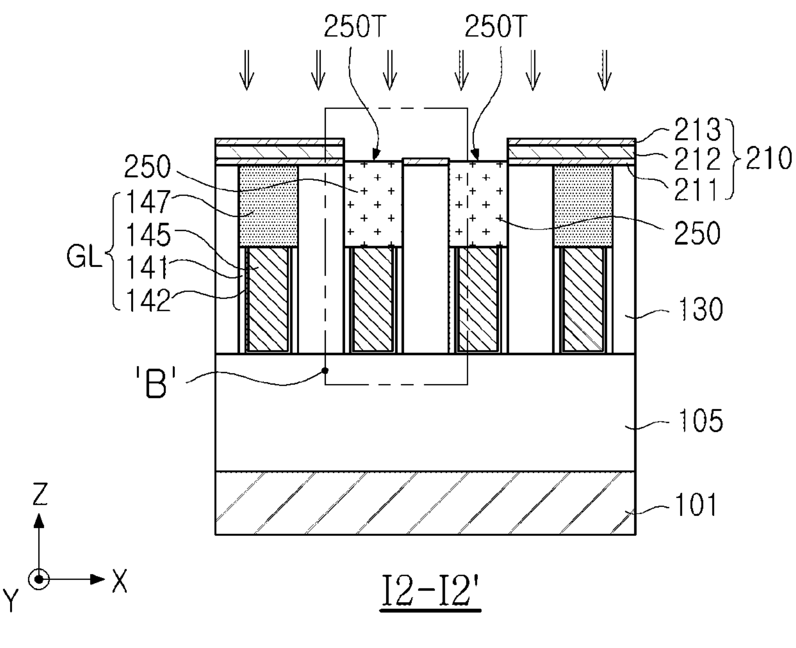
Figure 8C:
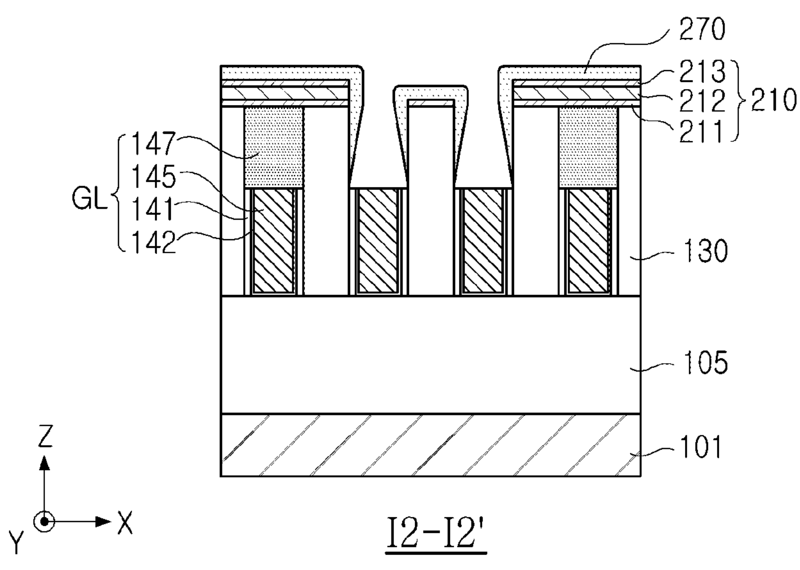

Next, referring to FIG. 8C, an etch stop layer 270 may be formed at the second temperature at which the pyrolysis material pattern 250 is decomposed.

The etch stop layer 270 may be formed on a portion of a side wall of the separation hole CH exposed by the decomposition of the pyrolysis material pattern 250, together with the upper surface of the mask layer 210. The second temperature at which the etch stop layer 270 is formed may be a temperature range at which the pyrolysis material pattern 250 is decomposed, and may be, for example, in the range of 150° C. to 300° C. The etch stop layer 270 may include a material of the intergate insulating portion 130, and a material having an etch selectivity. For example, the etch stop layer 270 may include silicon oxynitride, silicon nitride, silicon carbonitride, silicon carbide, amorphous silicon, polysilicon, or amorphous carbon.

As described above, the etch stop layer 270 formed during the decomposition of the pyrolysis material pattern 250 may have a structure that covers or overlaps an inner side wall of the separation hole CH and does not exist on a bottom surface of the separation hole CH to expose a gate electrode. An example of a process of forming the etch stop layer will be described in detail with reference to FIGS. 9A to 9C.

Figure 9A:
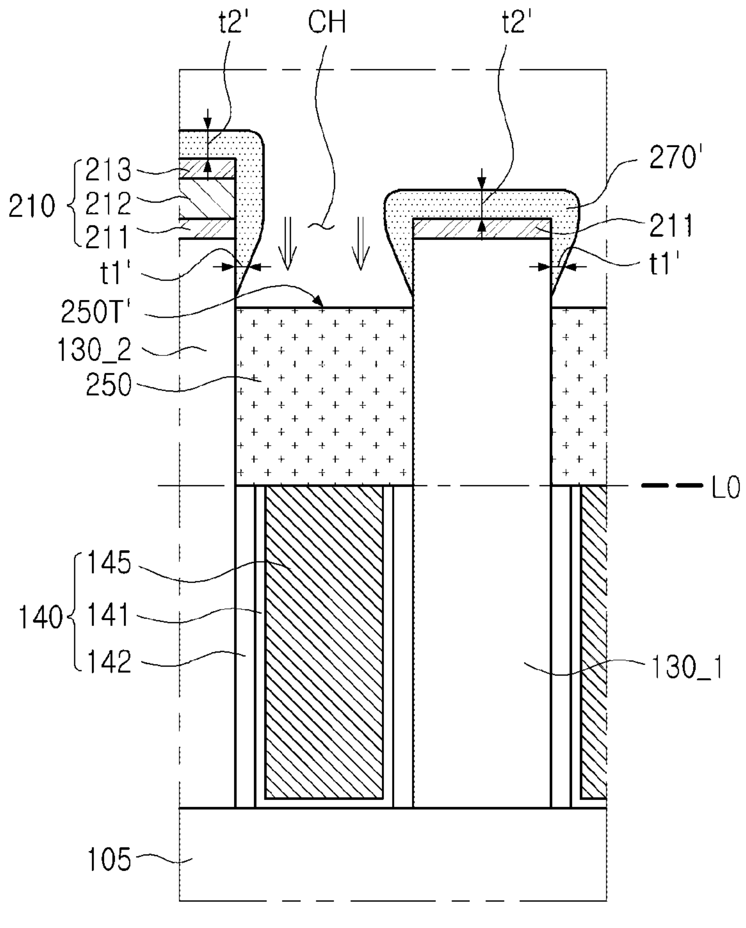
FIGS. 9A to 9C are cross-sectional views of each major process illustrating a process of forming an etch stop layer and cutting a gate line using the same.
Figure 9B:
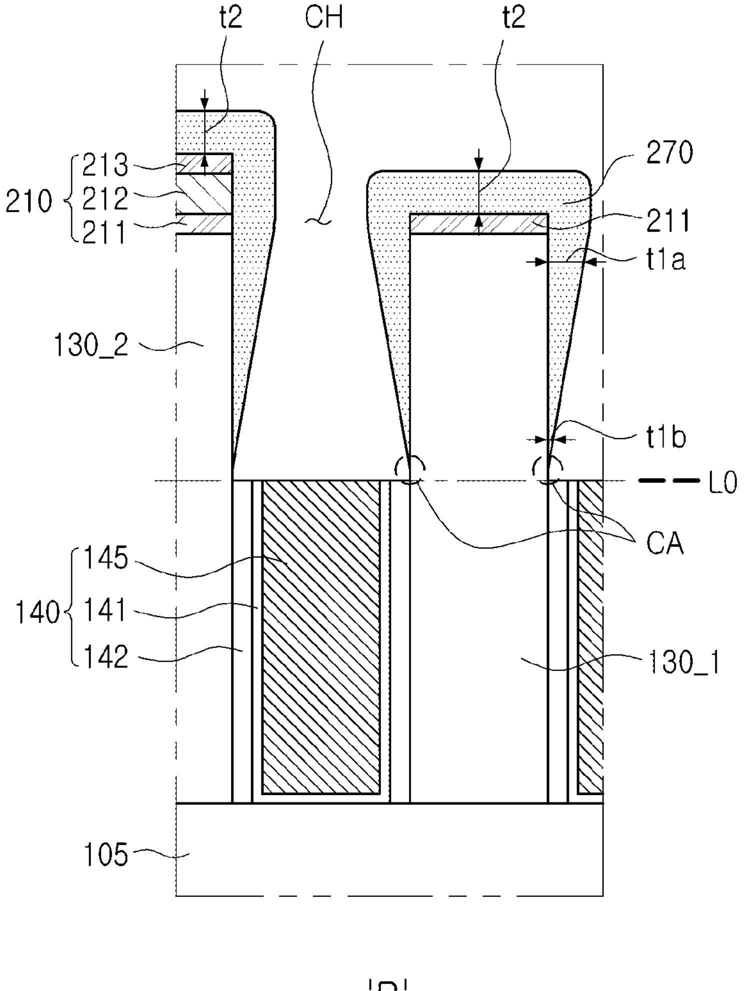
Figure 9C:
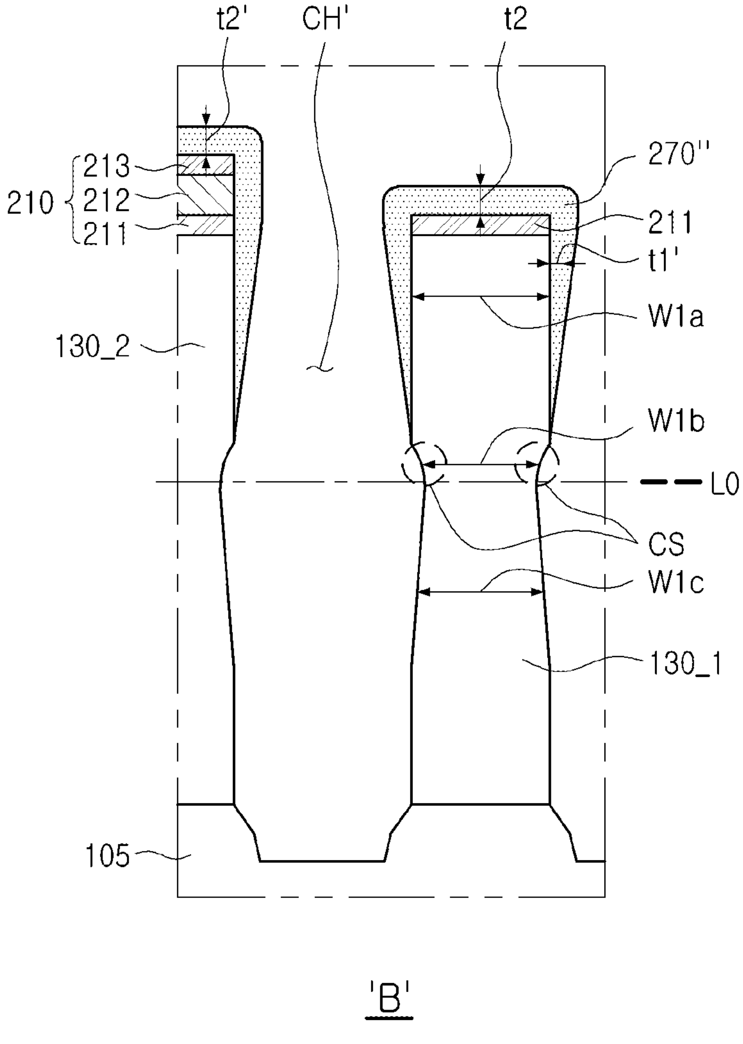

FIGS. 9A to 9C are cross-sectional views of each major process illustrating a process of forming an etch stop layer and cutting a gate line using the same, and can be understood as an enlarged view of portion “B” of FIG. 8B, respectively.

Referring to FIG. 9A, a process of forming an initial etch stop layer 270' is illustrated. When a source material for the etch stop layer 270' is supplied at a second temperature at which a pyrolysis material pattern 250 is decomposed, the etch stop layer 270' may also be deposited on a portion of a side wall of a separation hole CH on which the pyrolysis material pattern 250 is decomposed and exposed, as well as on an upper surface of a mask layer 210. Since the source material for the etch stop layer 270' in which the etch stop layer 270' is adsorbed on the pyrolysis material pattern 250 is removed along with the decomposition of the pyrolysis material pattern 250, the source material may not be deposited on a remaining upper surface 250T' of the pyrolysis material pattern 250.

The etch stop layer 270' may include a first portion on the mask layer 210' and a second portion on the portion of the side wall of the separation hole CH, and a thickness t2' of the first portion may be thicker than a thickness t1' of the second portion. As such, since the second portion of the etch stop layer 270' may be formed after the pyrolysis material portion of the side wall portion is decomposed, the thickness t1' may be thinner than the thickness t2' of the first portion.

Subsequently, referring to FIG. 9B, while the pyrolysis material pattern 250 is removed, an etch stop layer 270 may be formed on an inner side wall of the separation hole CH that may be additionally exposed, and, before or at a time point that the pyrolysis material pattern 250 is removed, the supply of the source material for the etch stop layer 270 may be stopped. This stop may prevent the etch stop layer 270 from being formed on an upper surface of a gate electrode 145, which may not be desired.

A thickness of the already formed etch stop layer 270' may increase, in a process of forming the etch stop layer 270, which continues until the removal of the pyrolysis material pattern 250. Similar to the previous operation, the etch stop layer 270 may include a first portion on the mask layer 210' and a second portion on the portion of the side wall of the separation hole CH, and a thickness t2 of the first portion may be thicker than a thickness t1 of a second portion. In addition, the second portion of the etch stop layer 270 may include a region having a thickness that becomes thinner (t1a→t1b) as it approaches a substrate 101. Specifically, the second portion of the etch stop layer 270 may include an upper region and a lower region, and a thickness t1b of the lower region may be thinner than a thickness t1a of the upper region.

In addition, as described above, since the pyrolysis material pattern 250 may be stopped before being completely removed, an exposed region CA not covered or not overlapped by the etch stop layer 270 may be present a region adjacent to a level LO of an upper surface of the gate electrode 145. Although the exposed region CA may not exist depending on when the supply of the source material is stopped, a portion of the etch stop layer in the adjacent region may be formed to have a thickness that is much thinner than other portions.

As such, the etch stop layer 270 formed during the decomposition of the pyrolysis material pattern 250 may have a structure in which a bottom surface of the separation hole CH is exposed while covering or overlapping the inner side wall of the separation hole CH. For example, the etch stop layer 270 may protect an intergate insulating portion 130 in the separation hole, but a remaining portion of a gate line, e.g., a gate electrode may be exposed through the separation hole CH.

Figure 8D:
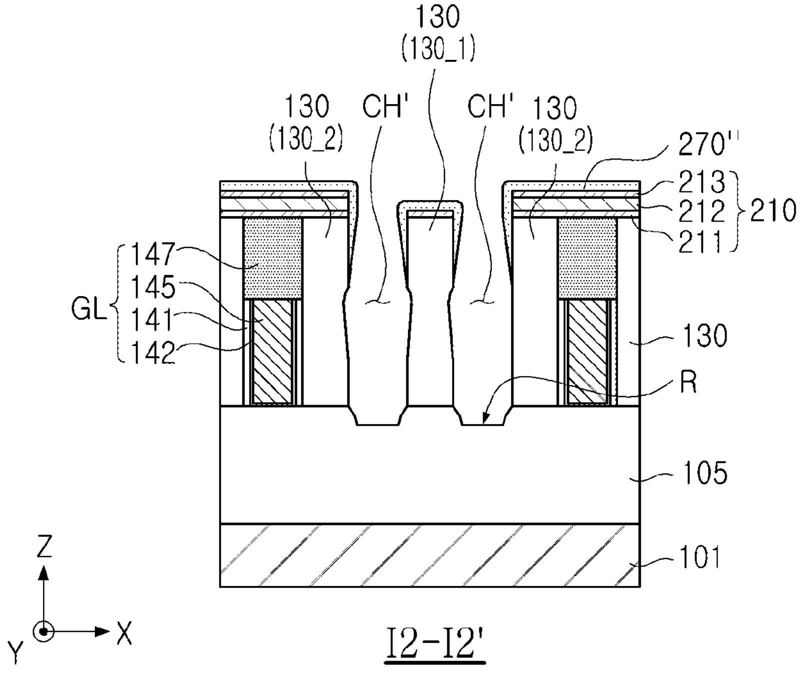

Next, referring to FIG. 8D, a remaining portion of the gate line GL may be removed through the separation hole CH using the etch stop layer 270.

In this process, the gate electrode 145 may be removed to expand the separation hole CH'. In some embodiments, the gate electrode 145 may be oxidized and then removed by wet etching. Additionally, the gate dielectric film 142 and/or the gate spacer 141 may also be removed. During this etching process, the intergate insulating portion 130 may be protected by the previously formed etch stop layer 270. In particular, as described above, since the upper region of the intergate insulating portion 130 may be protected with almost no loss, a process such as forming a contact structure may be stably performed.

FIG. 9C may be an enlarged cross-sectional view of portion “B” in FIG. 8D.

Referring to FIG. 9C together with FIG. 8D, during this removal process, a concave portion CS may be formed in the portion corresponding to the exposed region CA of the intergate insulating portion 130. The concave portion CS may be concave-shaped downward towards substrate 101. The concave portion CS may be located in a region adjacent to the level LO of the gate electrode 145. A first intergate insulating portion 130_1 may have a second width W1b of an intermediate region, narrower than a first width W1a of an upper end. The second width W1b of the intermediate region may be narrower than a third width W1c of a lower region.

In a process of removing the gate electrode 145, the lower region may also be partially etched. The lower region may have a portion having the third width W1c that may be slightly narrower than the first width W1a of the upper end. A lower end (i.e., a bottom portion) of the lower region 130L may have a width, equal to or wider than the first width W1a. Even in this etching process, even a small amount of an etch stop layer 270" may be removed, such that thicknesses t1" and t2" may change. Detailed descriptions of a side profile of the intergate insulating portion 130 after the gate electrode 145 is removed may refer to the description of FIG. 4.

Figure 8E:
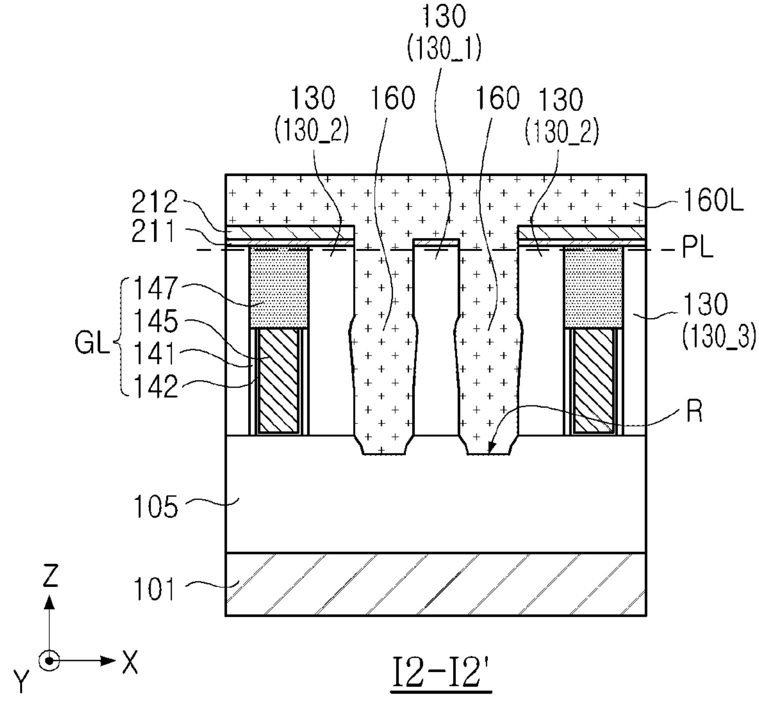

Next, referring to FIG. 8E, a gate separation pattern 160 may be formed in the expanded separation hole CH'.

The gate separation pattern 160 may be formed by filling an expanded separation hole CH' with an insulating material. The insulating material filled in the gate separation pattern 160 may include an insulating material, different from that of the interlayer insulating layer 130. For example, the gate separation pattern 160 may include silicon nitride (SiN), silicon oxynitride (SiON), silicon carbonitride (SiCN), or silicon oxycarbonitride (SiOCN), and the interlayer insulating layer 130 may include a low dielectric constant material such as silicon oxide. As described with reference to FIGS. 4 and 9C, the gate separation pattern 160 may have a side profile corresponding to a side profile of the intergate insulating portion 130, surrounding the same, in a cross-section in the first direction.

Figure 10:
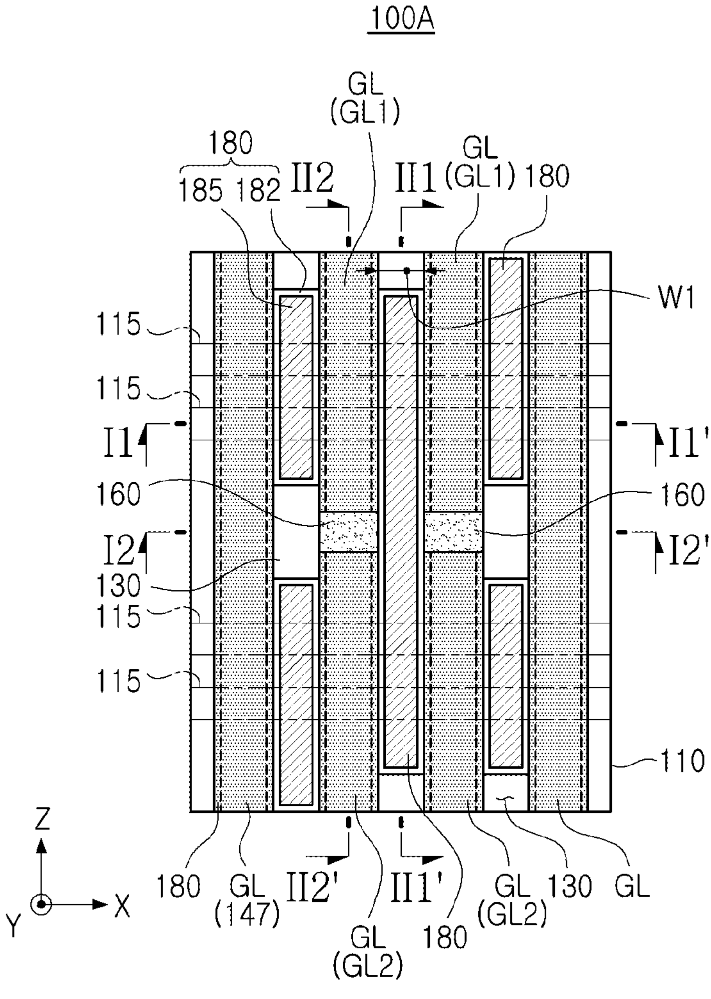
FIG. 10 is a plan view illustrating a semiconductor device according to some embodiments.
Figure 11A:
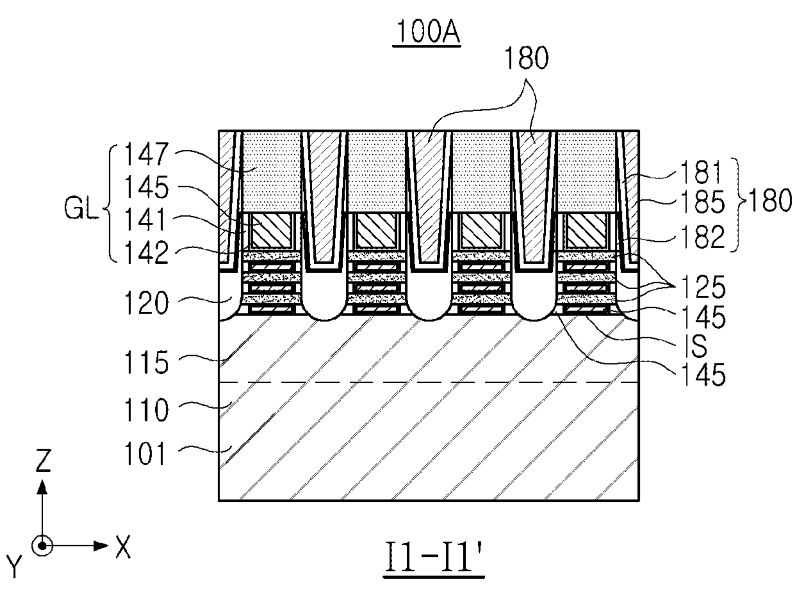
FIGS. 11A and 11B are cross-sectional views of the semiconductor device illustrated in FIG. 10, taken along lines I1-I1' and I2-I2', respectively.
Figure 11B:
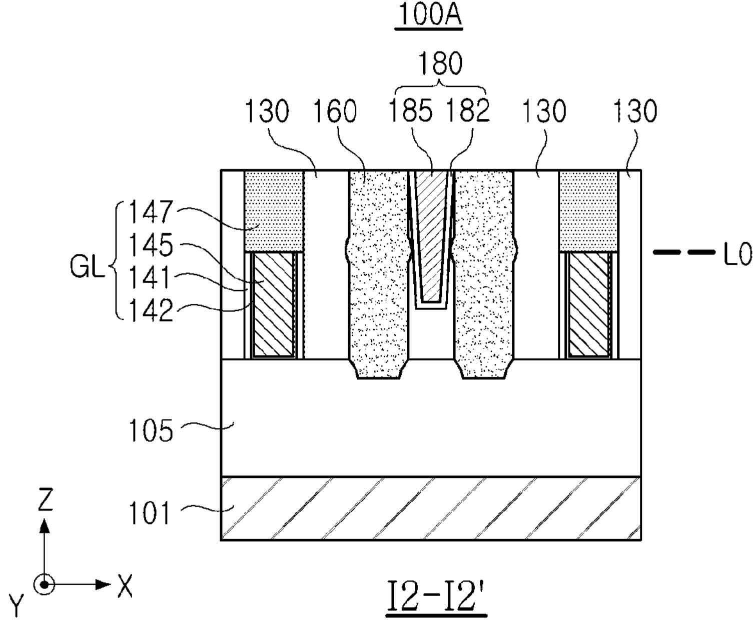
Figure 12A:
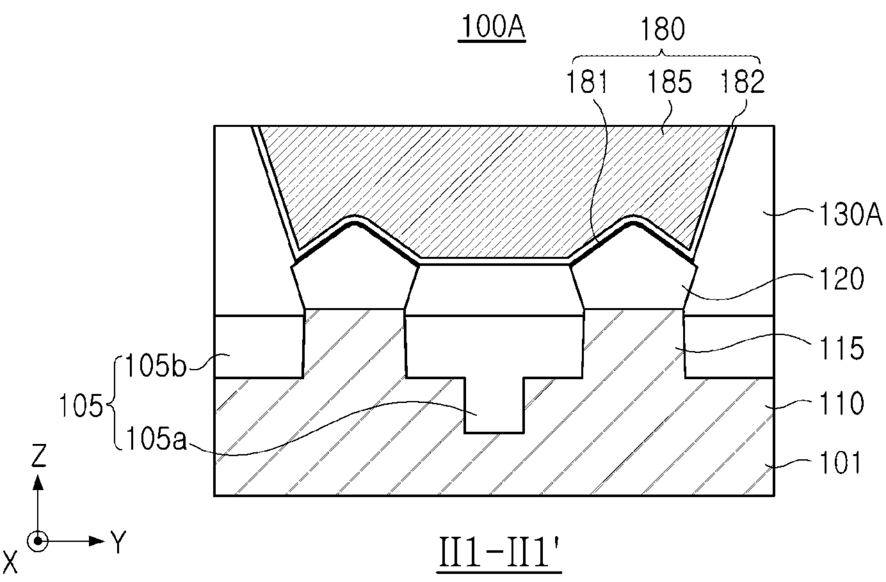
FIGS. 12A and 12B are cross-sectional views of the semiconductor device illustrated in FIG. 10, taken along lines II1-II1' and II2-II2', respectively.
Figure 12B:
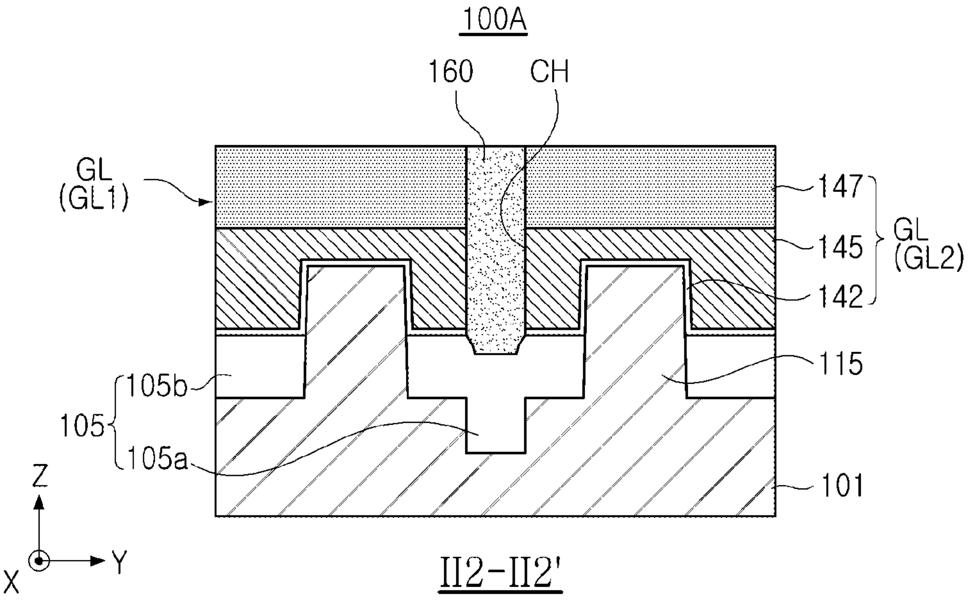

FIG. 10 is a plan view illustrating a semiconductor device according to some embodiments, and FIGS. 11A and 11B are cross-sectional views of the semiconductor device illustrated in FIG. 10, taken along lines I1-I1' and I2-I2', respectively. FIGS. 12A and 12B are cross-sectional views of the semiconductor device illustrated in FIG. 10, taken along lines II1-II1' and II2-II2', respectively.

Referring to FIGS. 10 to 12B, it can be understood that a semiconductor device 100A according to the present embodiment is similar to the semiconductor device illustrated in FIGS. 1 to 4, except that a multi-channel structure is implemented using a plurality of channel layers 125, and a contact structure 180 is located between gate separation patterns 160. In addition, components of the present embodiment can be understood with reference to descriptions of the same or similar components of the embodiment illustrated in FIGS. 1 to 4, unless otherwise stated.

A semiconductor device 100A according to the present embodiment may include an active pattern 115 extending in the first direction (e.g., the X-direction) on an active region 110. In addition, the semiconductor device may include a plurality of channel layers 125 disposed on the active pattern 115 and spaced apart from each other in a direction, perpendicular to an upper surface of a substrate 101 (e.g., the Z-direction) and each having a nano-sheet structure, and a gate electrode 145 extending in the second direction (e.g., the Y-direction), intersecting the first direction (e.g., the X-direction) while surrounding the plurality of channel layers 125. As such, the gate electrode 145 employed in the present embodiment may be formed to be interposed between the plurality of channel layers 125 as well as between gate spacers 141.

The semiconductor device according to the present embodiment may include a source/drain region 120 disposed in the active region 110 located on both sides of the gate electrode 145 and connected to the plurality of channel layers 125. In the present embodiment, the source/drain region 120 may be disposed on the active pattern 115 located on both sides of the gate electrode 145, and may be respectively connected to both sides in the first direction (e.g., the X-direction) of the plurality of channel layers 125.

In the present embodiment, the number of the channel layers 125 is illustrated as three (3), but the number thereof is not particularly limited. The channel layers 125 may be formed as semiconductor patterns. For example, the semiconductor patterns may include at least one of silicon (Si), silicon germanium (SiGe), or germanium (Ge). The source/drain region 120 may include an epitaxial layer formed using the plurality of channel layers 125 and a recessed surface of the active pattern 115, as seeds. The source/drain region 120 may include at least one of silicon germanium (SiGe), silicon (Si), or silicon carbide (SiC).

Internal spacers IS provided between each of the source/drain regions 120 and the gate electrode 145 may be included. The internal spacers IS may be provided on one side of the gate electrode 145. The internal spacers IS and the channel layers 125 may be alternately located in the third direction (e.g., the Z-direction), perpendicular to the upper surface of the substrate 101. Each of the source/drain regions 120 may be in contact with the channel layer 125, and may be spaced apart from the gate electrode 145 with the internal spacers IS interposed therebetween. A gate dielectric film 142 may be interposed between the gate electrode 145 and each of the channel layers 125, and may extend between the gate electrode 145 and each of the internal spacers IS. As described above, the semiconductor device according to the present embodiment may include a gate-all-around type field effect transistor.

Referring to FIGS. 10, 11A, and 11B, the semiconductor device 100A may include a plurality of gate lines GL and a plurality of intergate insulating portions 130, alternately arranged in the first direction (e.g., the X-direction). Some of the gate lines may be separated into two gate lines GL1 and GL2 by two gate separation patterns 160 adjacent to each other in the first direction.

In a process of cutting the gate lines GL during a process of manufacturing the semiconductor device 100A according to the present embodiment, a portion of an interlayer insulating layer (i.e., the intergate insulating portion 130) adjacent to a separation hole may be covered or overlapped using a pyrolysis material, and an etch stop layer exposing the gate electrode of a cut region may be formed. Such an etch stop layer may greatly reduce loss of the intergate insulating portion 130, particularly loss of an upper region of the intergate insulating portion 130, during the process of cutting the gate line. As a result, an intergate insulating portion 130 adjacent to a gate cut region (a gate separation structure) may have a width, narrower than a width of an upper end in a region adjacent to a level LO of an upper surface of the gate electrode 145.

According to the present embodiment, in a cut process of a gate line formed by a replacement metal gate (RMG) process, an etch stop layer exposing a gate electrode in a cut region and covering or overlapping a portion of an interlayer insulating layer (i.e., an intergate insulating portion) adjacent to a separation hole, may be easily formed using a pyrolysis material. Loss of the interlayer insulating layer may be effectively reduced during the cut process of the gate line. As a result, an interlayer insulating layer adjacent to a gate cut region (a gate separation structure) may have a width, narrower than a width of an upper end of the interlayer insulating layer, in a region adjacent to an upper surface of the gate electrode.

Various advantages and effects of the present inventive concept are not limited to the above, and will be more easily understood in the process of describing specific embodiments.

While embodiments have been illustrated and described above, it will be apparent to those skilled in the art that modifications and variations could be made without departing from the scope of the present inventive concept as defined by the appended claims.

What is claimed is:

1. A method of manufacturing a semiconductor device, comprising:

providing a semiconductor structure including a plurality of active patterns that extend on a substrate in a first direction, a plurality of gate lines that intersect the plurality of active patterns and extend in a second direction that intersects the first direction, and an interlayer insulating layer having a plurality of intergate insulating portions that overlap in a direction perpendicular to a surface of the substrate respective ones of the plurality of active patterns and are respectively between ones of the plurality of gate lines, wherein each of the plurality of gate lines includes a gate electrode and a gate capping layer on the gate electrode;

forming a mask layer on the plurality of gate lines and the plurality of intergate insulating portions;

forming an opening that exposes a cut region of the plurality of gate lines in the mask layer;

forming a separation hole by removing a portion of the gate capping layer exposed by the opening, using the mask layer;

forming a pyrolysis material pattern in the separation hole, wherein an upper surface of the pyrolysis material pattern is closer to the substrate than an upper surface of the mask layer;

exposing a side wall portion of the separation hole by decomposing a portion of the pyrolysis material pattern;

forming an etch stop layer on the upper surface of the mask layer and on the exposed side wall portion of the separation hole, wherein exposing the side wall portion of the separation hole by decomposing the portion of the pyrolysis material pattern comprises removing a source material of the etch stop layer adsorbed on the pyrolysis material pattern while decomposing the portion of the pyrolysis material pattern; and selectively removing a portion of the gate electrode exposed by the separation hole using the etch stop layer.

2. The method of claim 1, wherein the forming the pyrolysis material pattern in the separation hole, comprises:

forming a pyrolysis material layer on the mask layer and on a sidewall of the separation hole; and removing a portion of the pyrolysis material layer that is on the mask layer using a heat recess process.

3. The method of claim 2, wherein the heat recess process is performed at a temperature of 200 to 450° C.

4. The method of claim 1, wherein the pyrolysis material pattern comprises an organic compound including carbon, hydrogen, oxygen, and/or nitrogen.

5. The method of claim 1, wherein the forming the etch stop layer is performed at a temperature at which the pyrolysis material pattern is decomposed.

6. The method of claim 5, wherein the temperature comprises a range of 150° C. to 300° C.

7. The method of claim 1, wherein the etch stop layer comprises silicon oxynitride, silicon nitride, silicon carbonitride, silicon carbide, amorphous silicon, polysilicon, or amorphous carbon.

8. The method of claim 1, wherein the etch stop layer comprises a first portion on the mask layer and a second portion on the side wall portion of the separation hole, and wherein a thickness of the first portion is thicker than a thickness of the second portion.

9. The method of claim 1, wherein removing the portion of the gate electrode comprises:

removing the gate electrode by etching, wherein, during the etching, protecting an upper region of the intergate insulating portion by the etch stop layer.

10. The method of claim 8, wherein the second portion of the etch stop layer comprises an upper region and a lower region, and wherein a thickness of the lower region that is closer to the substrate is less than a thickness of the upper region.

11. The method of claim 1, wherein, after the removing the portion of the gate electrode, a width of an upper end of a first intergate insulating portion adjacent to the separation hole in the first direction is substantially equal to a width of an upper end of a second intergate insulating portion separated from the separation hole in the first direction.

12. The method of claim 11, wherein a width of an intermediate region of the first intergate insulating portion in the first direction is narrower than a width of an intermediate region of the second intergate insulating portion in the first direction.

13. The method of claim 1, wherein, after the removing the portion of the gate electrode, a first intergate insulating portion adjacent to the separation hole has an intermediate region having a width that is narrower than a width of an upper end of the first intergate insulating portion in the first direction.

14. The method of claim 13, wherein the intermediate region is adjacent to an upper surface of the gate electrode.

15. The method of claim 1, further comprising, after the removing the portion of the gate electrode:

forming a gate separation pattern in the separation hole from which the gate electrode portion has been removed.

16. A method of manufacturing a semiconductor device, comprising:

providing a semiconductor structure including a plurality of active patterns that extend on a substrate in a first direction, a plurality of gate lines that intersect the plurality of active patterns and extend in a second direction that intersects the first direction, and a plurality of intergate insulating portions that overlap in a direction perpendicular to a surface of the substrate respective ones of the plurality of active patterns and are respectively between ones of the plurality of gate lines, wherein each of the plurality of gate lines includes a gate electrode and a gate capping layer on the gate electrode;

forming a mask layer on the plurality of gate lines and the plurality of intergate insulating portions;

forming an opening that exposes a cut region of the plurality of gate lines in the mask layer;

forming a separation hole by removing a portion of the gate capping layer exposed by the opening using the mask layer;

forming a pyrolysis material layer on the mask layer and in the separation hole;

forming a pyrolysis material pattern in the separation hole by recessing the pyrolysis material layer, at a first temperature at which the pyrolysis material layer is decomposed;

exposing a side wall portion of the separation hole by decomposing a portion of the pyrolysis material pattern;

forming an etch stop layer on an upper surface of the mask layer and on the exposed side wall portion of the separation hole, at a second temperature at which the pyrolysis material pattern is decomposed, wherein exposing the side wall portion of the separation hole by decomposing the portion of the pyrolysis material pattern comprises removing a source material of the etch stop layer adsorbed on the pyrolysis material pattern while decomposing the portion of the pyrolysis material pattern; and selectively removing a portion of the gate electrode exposed by the separation hole using the etch stop layer.

17. The method of claim 16, wherein the first temperature is higher than the second temperature.

18. The method of claim 17, wherein the first temperature ranges from 200° C. to 450° C., and the second temperature ranges from 150° C. to 300° C.

19. The method of claim 16, wherein, after the selectively removing the portion of the gate electrode, an intergate insulating portion adjacent to the separation hole has an intermediate region having a width that is narrower than a width of an upper end of the intergate insulating portion in the first direction, wherein the intermediate region is adjacent to an upper surface of the gate electrode.

20. A method of manufacturing a semiconductor device, comprising:

providing a semiconductor structure including a plurality of active patterns that extend on a substrate in a first direction, a plurality of gate lines that intersect the plurality of active patterns and extend in a second direction that intersects the first direction, and a plurality of intergate insulating portions that overlap in a direction perpendicular to a surface of the substrate respective ones of the plurality of active patterns and are respectively between ones of the plurality of gate lines, wherein the plurality of gate lines include first and second gate lines adjacent to each other, and wherein each of the plurality of gate lines includes a gate, an electrode and a gate capping layer on the gate electrode;

forming a mask layer on the plurality of gate lines and the plurality of intergate insulating portions;

forming a first opening that exposes a first cut region of the first gate line and a second opening that exposes a second cut region of the second gate line, in the mask layer, wherein the first and second cut regions are adjacent one another in the first direction;

forming first and second separation holes by removing portions of the gate capping layer exposed by the first and second openings using the mask layer;

including pyrolysis material patterns in each of the first and second separation holes, wherein upper surfaces of the pyrolysis material patterns are closer to the substrate than an upper surface of the mask layer;

exposing side wall portions of the first and second separation holes by decomposing portions of the pyrolysis material patterns;

forming an etch stop layer on the upper surface of the mask layer and on the exposed side wall portions of the first and second separation holes; and removing portions of the gate electrode exposed by the first and second separation holes using the etch stop layer.

* * * * *